(12) United States Patent
Wood et al.

(10) Patent No.: US 6,828,175 B2
(45) Date of Patent: Dec. 7, 2004

(54) SEMICONDUCTOR COMPONENT WITH BACKSIDE CONTACTS AND METHOD OF FABRICATION

(75) Inventors: Alan G. Wood, Boise, ID (US); Trung Tri Doan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 16 days.

(21) Appl. No.: 10/457,774

(22) Filed: Jun. 10, 2003

(65) Prior Publication Data

US 2004/0043603 A1 Mar. 4, 2004

Related U.S. Application Data

(62) Division of application No. 10/232,549, filed on Aug. 29, 2002.

(51) Int. Cl.[7] .......................... H01L 21/44; H01L 21/48; H01L 21/50; H01L 21/301; H01L 21/31

(52) U.S. Cl. ....................... 438/113; 462/464; 462/759; 462/977

(58) Field of Search .................... 438/113, 462, 438/464, 759, 977, FOR 386, FOR 485

(56) References Cited

U.S. PATENT DOCUMENTS

| 5,071,792 | A | * | 12/1991 | VanVonno et al. ............ 438/17 |
| 5,138,434 | A | | 8/1992 | Wood et al. |
| 5,485,039 | A | | 1/1996 | Fujita et al. |
| 5,686,317 | A | | 11/1997 | Akram et al. |

(List continued on next page.)

FOREIGN PATENT DOCUMENTS

| JP | 10-79262 | 3/1998 |
| JP | 2000-31185 | 1/2000 |

OTHER PUBLICATIONS

U.S. patent application Ser. No. 09/652,340, Farnworth.

U.S. patent application Ser. No. 09/640,801, Farnworth et al.

U.S. patent application Ser. No. 10/094,161, Farnworth et al., filed Mar. 6, 2002.

Advanced Coating Parylene Conformal Coating Specialists, advertising material, pp. 1–7, 1998.

Dexter Electronic Materials, Hysol FP4451 Material Properties, spec sheet, pp. 1–2, Aug. 20, 1999.

Dexter Electronic Materials, Hysol FP4450 Material Properties, spec sheet, pp. 1–2, Aug. 20, 1999.

Parylene Coating, advertising for Specialty Coating Systems, pp. 1–2, date unknown.

"Wafer Size CSP Packaging by VPES", Japan Rec Co., advertising material, pp. 1–4, 1998.

David Francis & Linda Jardine, "Thin, Wafer–Level Package Is Made Without Damaging Die", Chip Scale Review, May/Jun. 2002, p. 70.

Jeffrey C. Demmin, "More Wafer Thinning at ICAPS", media new analysis, Mar. 13, 2002.

Primary Examiner—David E. Graybill
(74) Attorney, Agent, or Firm—Stephen A. Gratton

(57) ABSTRACT

A semiconductor component includes back side pin contacts fabricated using a circuit side fabrication method. The component also includes a thinned semiconductor die having a pattern of die contacts, and conductive members formed by filled openings in the die contacts and the die. In addition, the pin contacts are formed by terminal portions of the conductive members. The fabrication method includes the steps of forming the openings and the conductive members, and then thinning and etching the die to form the pin contacts. An alternate embodiment female component includes female conductive members configured to physically and electrically engage pin contacts on a mating component of a stacked assembly.

27 Claims, 8 Drawing Sheets

U.S. PATENT DOCUMENTS

| | | |
|---|---|---|
| 5,851,911 A | 12/1998 | Farnworth |
| 5,888,883 A | 3/1999 | Sasaki et al. |
| 5,897,337 A | 4/1999 | Kata et al. |
| 5,904,546 A | 5/1999 | Wood et al. |
| 6,013,948 A | 1/2000 | Akram et al. |
| 6,060,373 A | 5/2000 | Saitoh |
| 6,080,602 A | 6/2000 | Tani et al. |
| 6,087,845 A | 7/2000 | Wood et al. |
| 6,107,109 A | 8/2000 | Akram et al. |
| 6,107,164 A | 8/2000 | Ohuchi |
| 6,114,240 A | 9/2000 | Akram et al. |
| 6,130,111 A | 10/2000 | Ikuina et al. |
| 6,136,137 A | 10/2000 | Farnworth et al. |
| 6,150,717 A | 11/2000 | Wood et al. |
| 6,153,448 A | 11/2000 | Takahashi et al. |
| 6,169,329 B1 | 1/2001 | Farnworth et al. |
| 6,177,295 B1 | 1/2001 | De Samber et al. |
| 6,180,504 B1 | 1/2001 | Farnworth et al. |
| 6,221,751 B1 * | 4/2001 | Chen et al. .................. 438/612 |
| 6,233,185 B1 | 5/2001 | Beffa et al. |
| 6,281,131 B1 | 8/2001 | Gilton et al. |
| 6,294,837 B1 | 9/2001 | Akram et al. |
| 6,313,531 B1 | 11/2001 | Geusic et al. |
| 6,326,698 B1 | 12/2001 | Akram |
| 6,338,980 B1 * | 1/2002 | Satoh ......................... 438/106 |
| 6,350,664 B1 | 2/2002 | Haji et al. |
| 6,353,267 B1 | 3/2002 | Ohuchi et al. |
| 6,379,999 B1 * | 4/2002 | Tanabe ....................... 438/113 |
| 6,524,890 B2 | 2/2003 | Ueda et al. |
| 6,534,387 B1 | 3/2003 | Shinogi et al. |
| 6,579,748 B1 | 6/2003 | Okuno et al. |
| 6,607,970 B1 | 8/2003 | Wakabayashi |
| 6,649,445 B1 | 11/2003 | Qi et al. |

\* cited by examiner

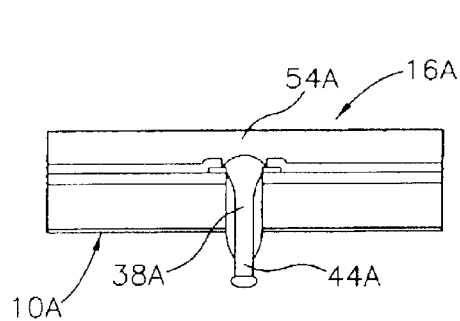
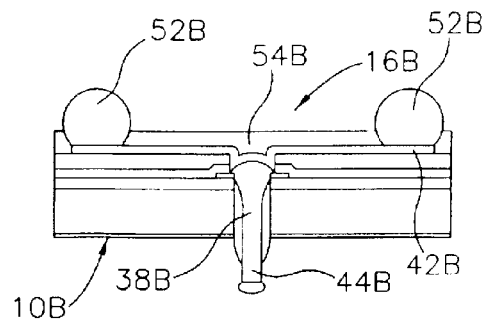
FIGURE 3A　　　　　FIGURE 3B
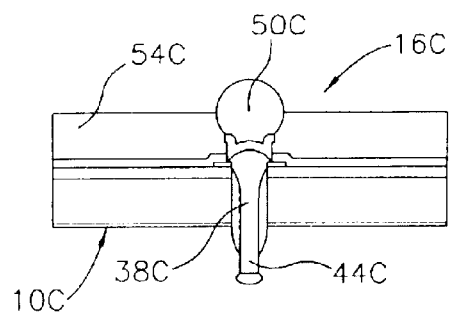
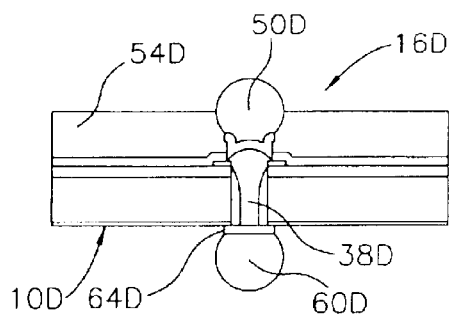
FIGURE 3C　　　　　FIGURE 3D
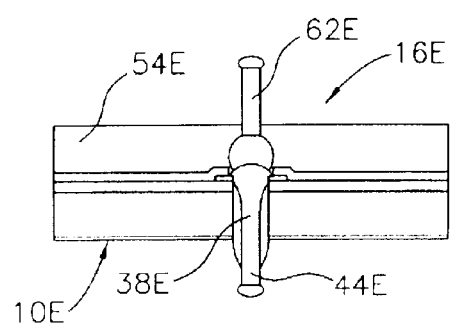
FIGURE 3E

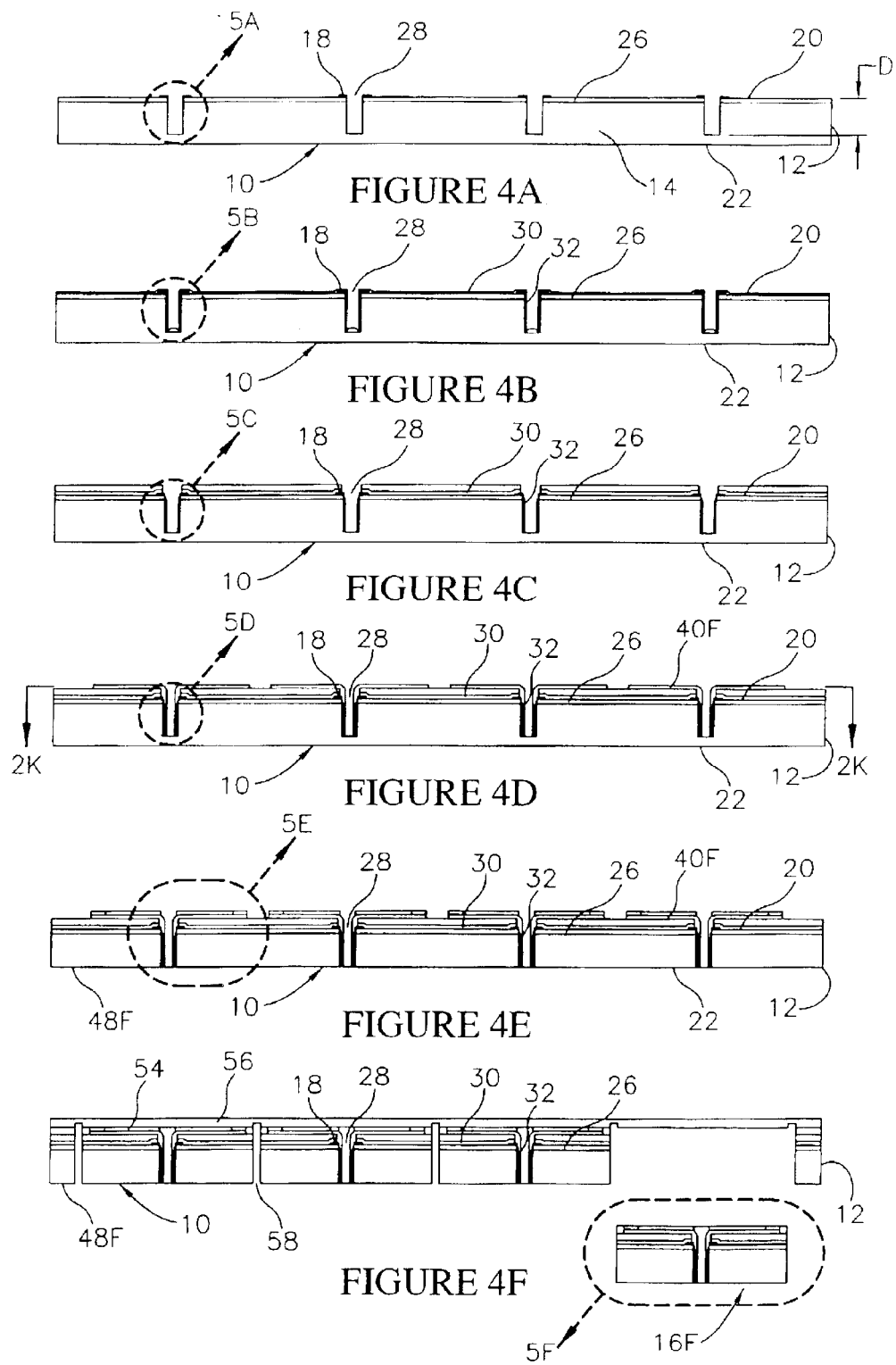

US 6,828,175 B2

SEMICONDUCTOR COMPONENT WITH BACKSIDE CONTACTS AND METHOD OF FABRICATION

CROSS REFERENCE TO RELATED APPLICATIONS

This application is a division of Ser. No. 10/232,549, filed Aug. 29, 2002.

FIELD OF THE INVENTION

This invention relates generally to semiconductor manufacture and packaging. More particularly, this invention relates to a semiconductor component with backside contacts, to a method for fabricating the component, and to systems incorporating the component.

BACKGROUND OF THE INVENTION

Semiconductor components, such as chip scale packages and bumped dice, are being manufactured with a smaller outline and with a higher pin count than conventional plastic or ceramic packages. This type of semiconductor component typically includes a dense area array of terminal contacts, such as solder bumps in a ball grid array (BGA) or metal pins in a pin grid array (PGA). The terminal contacts permit the component to be surface mounted to a supporting substrate, such as a package substrate, a module substrate or a circuit board.

The quality, reliability and cost of these types of components is often dependent on the fabrication method. The formation of the terminal contacts and the electrical paths between the terminal contacts and the dice are a particular concern. In particular, reliable electrical interconnections must be made between the terminal contacts for the component, and contacts on the dice contained within the component. Typically, the die contacts comprise thin film aluminum bond pads in electrical communication with integrated circuits on the dice.

Some prior art components require relatively complicated interconnections, such as metal beams or wires, formed of gold, gold plated materials, aluminum, copper or solder using a bonding process, such as thermosonic bonding or wire bonding. The interconnections, and their bonds with the die contacts and the terminal contacts, are subjected to stresses during manufacture, and during subsequent use of the component. These stresses can cause the interconnections to weaken or pull apart, adversely affecting the reliability of the components.

The present invention is directed to an improved semiconductor component having novel backside contacts and conductive member interconnections. In addition, the present invention is directed to a novel wafer level fabrication method for manufacturing the component in volume using conventional equipment.

SUMMARY OF THE INVENTION

In accordance with the present invention, an improved semiconductor component, a method for fabricating the component, and electronic assemblies incorporating the component are provided.

The component includes a semiconductor die having a thinned semiconductor substrate with a circuit side (front side) and a back side. The die includes integrated circuits and a pattern of die contacts on the circuit side in electrical communication with the integrated circuits. In a first embodiment (male version), the component includes an array of pin contacts on the backside, and conductive members in the substrate in electrical communication with the die contacts and the pin contacts. Each conductive member is formed by an opening in a die contact and substrate and a conductive material in the opening. In addition, each conductive member is exposed on the back side of the substrate to form a pin contact. The component can also include redistribution conductors and contacts on the circuit side in electrical communication with the conductive members.

In a second embodiment (female version) the conductive members comprise openings having insulated sidewalls plated with a conductive material. In this embodiment the conductive members are configured for mating physical and electrical engagement with a pin contact on an adjacent component of a stacked assembly.

The method for fabricating the component includes the step of providing multiple semiconductor dice on substrate, such as a semiconductor wafer, having a circuit side and a back side. The method also includes the steps of forming openings in the die contacts and part way through the substrate, forming an electrically insulating passivation layer on the circuit side and in the openings, and depositing a conductive material in the openings to form the conductive members. In addition, the method can include the steps of thinning and etching the substrate from the back side to expose terminal portions of the conductive members forming the pin contacts, and then singulating the dice from the wafer. The method can also include the steps of forming redistribution conductors on the circuit side in electrical communication with the conductive members and circuit side contacts on the redistribution conductors.

With the method the pin contacts are formed on the back side of the component using steps performed predominantly on the circuit side of the component. Advantageously, the pin contacts provide electrical connection points for performing various wafer level test procedures. In addition, the component can be integrated to form electronic assemblies such as modules, circuit boards and stacked arrays.

BRIEF DESCRIPTION OF THE DRAWINGS

FIGS. 3A–3E are schematic cross sectional views of alternate embodiments of the male component of FIG. 2I;

FIGS. 4A–4F are schematic cross sectional views illustrating steps in a fabrication method for an alternate embodiment female component having female conductive members;

DETAILED DESCRIPTION OF THE PREFERRED EMBODIMENTS

As used herein, the term "semiconductor component" refers to an electronic element that includes a semiconductor die. Exemplary semiconductor components include semiconductor packages, chip scale packages, semiconductor dice, BGA devices, and semiconductor wafers.

Referring to FIGS. 1A–1I and 2A–2K, steps in the method for fabricating a semiconductor component 16 (FIG. 2I) in accordance with the invention are illustrated.

Figure 1A:
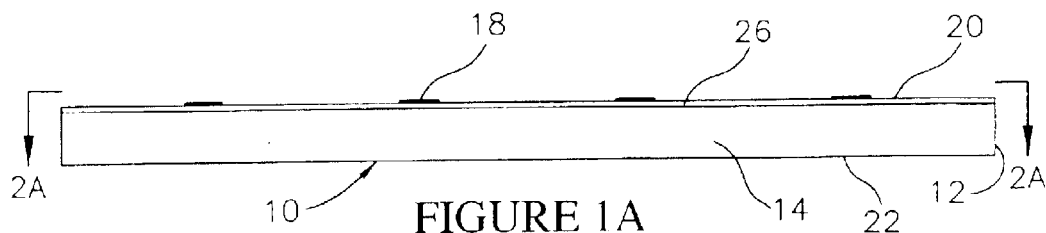
FIGS. 1A–1I are schematic cross sectional views illustrating steps in a method for fabricating a male semiconductor component in accordance with the invention.
Figure 2I:
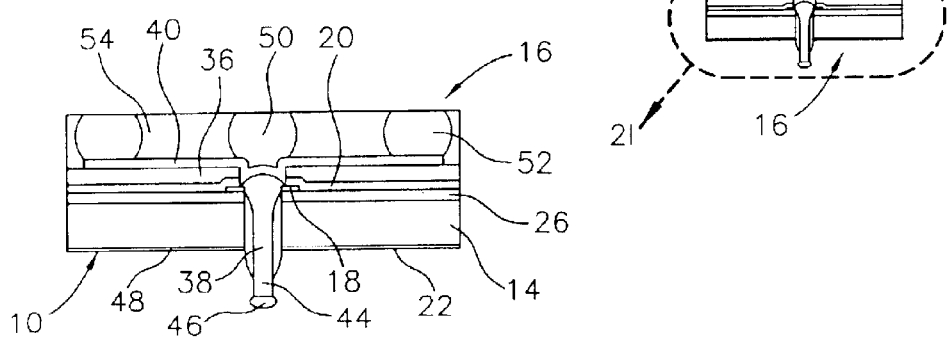
FIG. 2I is an enlarged view taken along line 2I of FIG. 1I illustrating the completed male component.
Figure 2A:
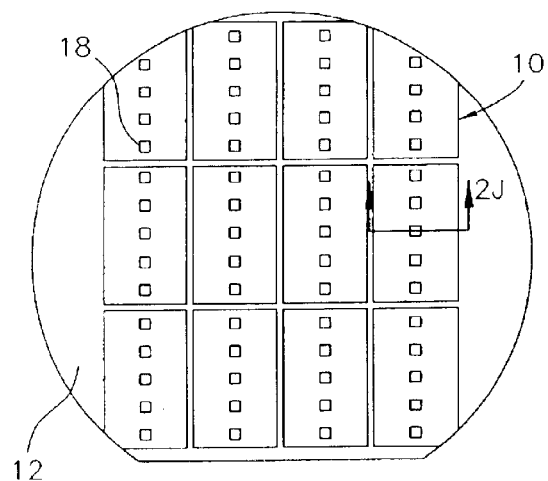
FIG. 2A is a plan view taken along line 2A—2A of FIG. 1A illustrating semiconductor dice on a wafer used in the fabrication method.

Initially, as shown in FIGS. 1A and 2A, a plurality of semiconductor dice 10 are provided, for fabricating a plurality of semiconductor components 16 (FIG. 2I).

The dice 10 can comprise conventional semiconductor dice having a desired configuration. For example, each die 10 can comprise a dynamic random access memory (DRAM), a static random access memory (SRAM), a flash memory, a microprocessor, a digital signal processor (DSP) or an application specific integrated circuit (ASIC). The dice 10 and the components 16 can have any polygonal shape. In the illustrative embodiment, the dice 10 and the components 16 are rectangular in shape, but other polygonal shapes, such as square or hexagonal can also be utilized.

As shown in FIG. 2A, the dice 10 are contained on a semiconductor wafer 12. Although in the illustrative embodiment, the method is performed on an entire semiconductor wafer 12, it is to be understood that the method can be performed on a portion of a wafer, on a panel, or on any other substrate that contains multiple semiconductor dice.

As shown in FIG. 1A, the wafer 12 and each die 10 includes a semiconductor substrate 14 having a circuit side 20 (front side or first side) wherein integrated circuits 24 (FIG. 2J) are located, and a back side 22 (second side). The circuit side 20 and the back side 22 are the major planar surfaces of each die 10. In addition, each die 10 includes a pattern of die contacts 18 formed on the circuit side 20, in a selected pattern, such as a dense area array, in electrical communication with the integrated circuits 24 (FIG. 2J) on the die 10. In the illustrative embodiment the die contacts 18 are the device bond pads for the die 10.

As shown in FIG. 2A, the die contacts 18 are generally square, planar pads having a desired size (e.g., 220–100 μm) and spacing. However, other polygonal shapes for the die contacts 18, such as rectangular, or circular shaped can also be employed. For simplicity the die contacts 18 are illustrated in a single row along the center of the die 10. However, the die contacts 18 can be arranged in any desired pattern including such as edge connect, end connect, and dense area arrays such as grid arrays and micro grid arrays.

Figure 2J:
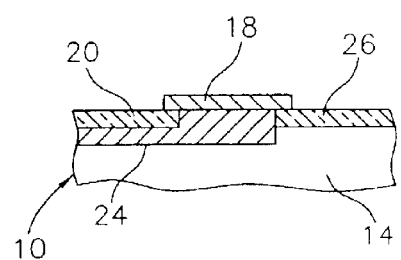
FIG. 2J is an enlarged cross sectional view taken along section line 2J—2J of FIG. 2A illustrating a die contact and integrated circuits on the male component.

The die contacts 18 can comprise a conventional metal such as aluminum, copper and alloys thereof. As shown in FIG. 2J, an insulating layer 26 on the circuit side 20, such as a layer of silicon dioxide, electrically insulates the integrated circuits 18 from the bulk of the substrate 14.

Figure 1B:
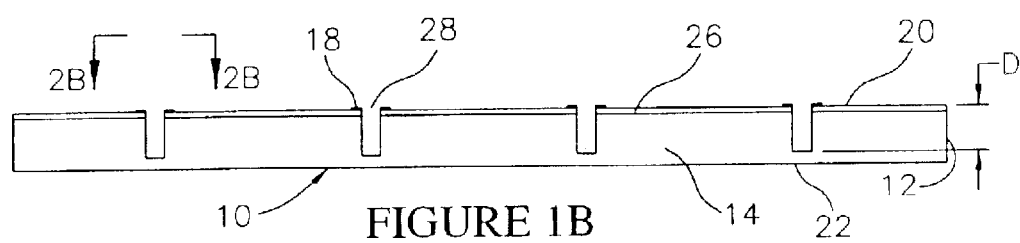
Figure 2B:
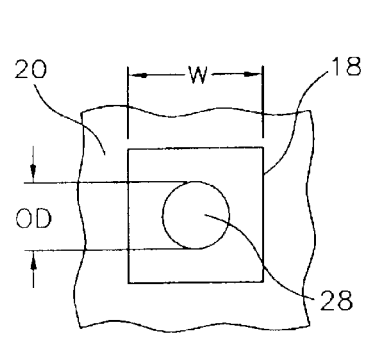
FIG. 2B is an enlarged plan view taken along line 2B—2B of FIG. 1B illustrating an opening in a die contact.

Next, as shown in FIGS. 1B and 2B, openings 28 are formed through the die contacts 18 and part way through the substrate 14. The openings 28 can be formed using an etching process, a laser machining process, an ion milling process, or combinations of these processes. One method for forming the openings 28 combines etching and laser machining processes. For example, an etch mask (not shown) and an etching process can be used to form the openings 28 through the die contacts 18. Depending on the material of the die contacts 18, a wet etchant can be used to etch the die contacts 18. For die contacts 18 made of aluminum, one suitable wet etchant is $H_3PO_4$.

The die contacts 18 can also be made with the openings 28 therein. For example, the openings 28 can be formed during deposition of the die contacts 18. In this case the etching and laser machining steps described above can be eliminated.

Figure 2C:
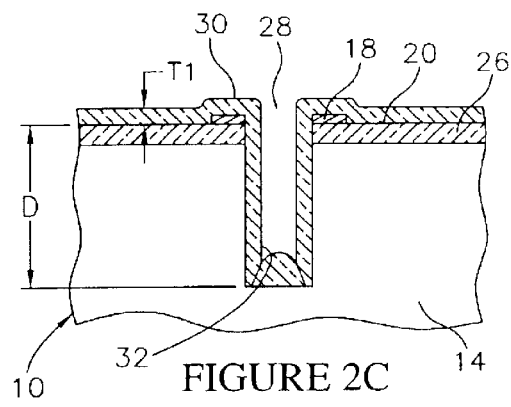
FIG. 2C is an enlarged view taken along line 2C of FIG. 1C illustrating a passivation layers in the opening and on the circuit side.

As shown in FIG. 2B, the openings 28 in the die contacts 18 are generally circular, and have an outside diameter OD that is smaller than the width W of the die contacts 18. In the illustrative embodiment, following formation of the openings 28, the die contacts 18 resemble square donuts having metal around their peripheries, but no metal in the center. Also in the illustrative embodiment, the diameter OD of the openings 28 is about one half the width W of the die contacts 18. In addition, the openings 28 following the etching step, but prior to the laser machining step, surround a portion of the substrate 14, such that the die contacts 18 and the openings 28 form targets, or a pattern recognition system, for a laser beam to counter bore the openings 28 part way through the substrate 14. As shown in FIG. 2C, the openings 28 can have a depth (D) of about 6 μm to 300 μm or greater, and a diameter (OD) of about 10 μm to 2 mils or greater.

One suitable laser system for performing the laser machining step is manufactured by XSIL LTD of Dublin, Ireland, and is designated a model no. XISE 200. Another suitable laser system for performing the laser machining step is manufactured by Electro Scientific, Inc., of Portland, Oreg. and is designated a Model No. 2700. A representative laser fluence for forming the openings 28 through a silicon substrate having a thickness of about 28 mils (711 μm), is from 2 to 10 watts/per opening at a pulse duration of 20–25 ns, and at a repetition rate of up to several thousand per second. The wavelength of the laser beam can be a standard UV wavelength (e.g., 355 nm).

Following the laser machining step, a cleaning step can be performed in which the openings 28 are cleaned using a suitable wet or dry etchant. One suitable wet etchant for cleaning the openings 28 with the substrate 14 comprising silicon is tetramethylammoniumhydroxide (TMAH).

Figure 1C:
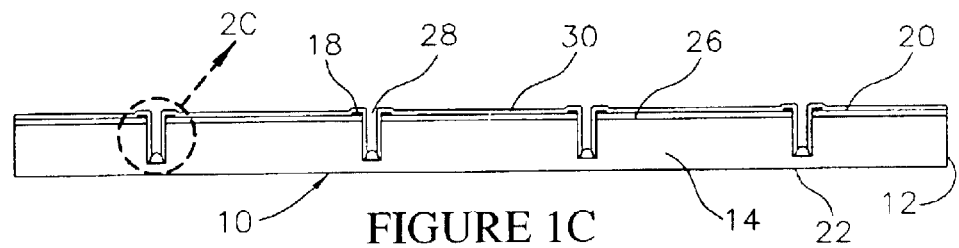

Next, as shown in FIGS. 1C and 2C, an electrically insulating passivation layer 30 is formed on the circuit side 20 of the wafer 12, and an electrically insulating passivation layer 32 is formed in the openings 28. The passivation layer 30 electrically insulates the circuit side 20, and the passivation layer 32 electrically insulates the openings 28. The passivation layers 30, 32 can comprise an electrically insulating material such as a glass, a polymer or an oxide formed as a layer of a required thickness. In the illustrative embodiment, the passivation layers 30, 32 are a single layer of the same material deposited to a same thickness. However, the passivation layers 30, 32 can be different materials deposited in different stages and with different thicknesses.

As shown in FIG. 2C, the passivation layers 30, 32 have a thickness T1 (FIG. 2C) that is less than the diameter OD of the openings 28, such that the sidewalls of the openings 28 are coated, but the openings 28 are not completely closed. A thickness range for the passivation layers 30, 32 can be from 0.10 $\mu$m to 100 $\mu$m or greater.

One suitable material for both passivation layers 30, 32 is borophosphosilicate glass (BPSG) which can be deposited to a required thickness using a spin-on or other suitable process. A photoimageable polymer such as polyimide can also be deposited to a required thickness using a spin-on, electrophoretic or other suitable process.

As another example, parylene polymers can be deposited from the vapor phase by a process similar to vacuum metallization at pressures of about 0.1 torr. Suitable polymers include parylene C, parylene N, and parylene D. Parylene is available from Advanced Coating of Tempe, Ariz. One suitable deposition apparatus for forming the passivation layers 30, 32 of parylene is a portable parylene deposition system, designated a model PDS 2010 LAB-COATER 2, manufactured by Specialty Coating Systems, of Indianapolis, Ind.

The passivation layer 30 can also comprise a first electrically insulating material formed on the circuit side 20, and the passivation layer 32 can comprise a second electrically insulating material formed in the openings 28. For example, the passivation layer 30 on the circuit side 20 can comprise a glass or a polymer layer formed as previously described, and the passivation layers 32 in the openings 28 can comprise silicon dioxide formed using a growth or deposition process. For example, silicon dioxide can be grown by exposure of the silicon substrate 12 within the openings 28 to oxygen at an elevated temperature (e.g., 950° C.).

Figure 1D:
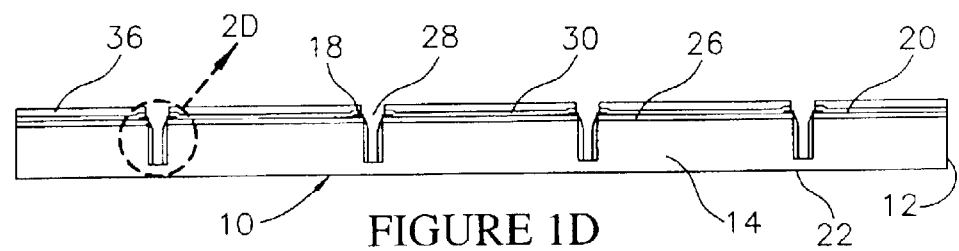
Figure 2D:
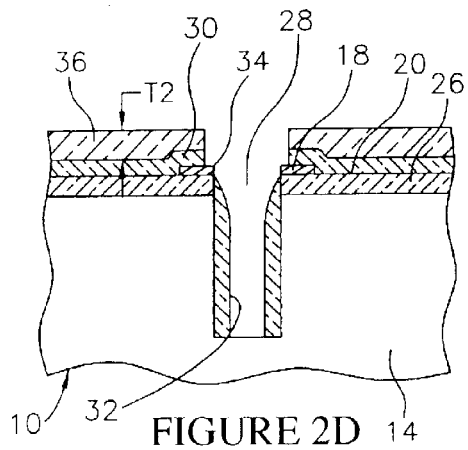
FIG. 2D is an enlarged view taken along line 2D of FIG. 1D illustrating an insulating layer on the circuit side.

Next, as shown in FIGS. 1D and 2D, the passivation layers 30, 32 can be patterned by etching, or other suitable process, to expose portions 34 of the die contacts 18. A mask (not shown) having openings aligned with the die contacts 18 can be used with a wet etchant to etch the passivation layers 30, 32. For example, with the passivation layers 30, 32 comprising BPSG one suitable etchant comprises HF. With the passivation layers 30, 32 comprising parylene an oxygen plasma process or a laser ablation process rather than an etchant can be employed.

As also shown in FIG. 2D, an electrically insulating polymer layer 36 is formed on the circuit side 20 and patterned such that the exposed portions 34 of the die contacts 18 remain exposed. The polymer layer 36 preferably comprises a low dielectric constant (low k) polymer such as polyimide, polybenzoxazole (PBO), or benzocyclobutene (BCB). As used herein, the term "low k" refers to a material with a dielectric constant of less than about 3.9.

The polymer layer 36 can be deposited to a desired thickness T2 using a suitable deposition process such as spin-on, positive displacement through a nozzle, screen printing or stenciling. Systems are commercially available for performing each of these processes in the context of semiconductor packaging. For example, material dispensing systems are manufactured by Asymtek of Carlsbad, Calif., and by Camalot of Cookson, UK. A representative range for the thickness T2 of the polymer layer 36 can be from 10 $\mu$m to several mils.

Following deposition, the polymer layer 36 can be cured and then patterned by etching or other suitable process to expose the exposed portions 34 of the die contacts 18. For example, the polymer layer 36 can comprise a photoimageable material, such as a low k resist. In this case, exposure and development of the polymer layer 36 forms openings aligned with the die contacts 18.

Figure 1E:
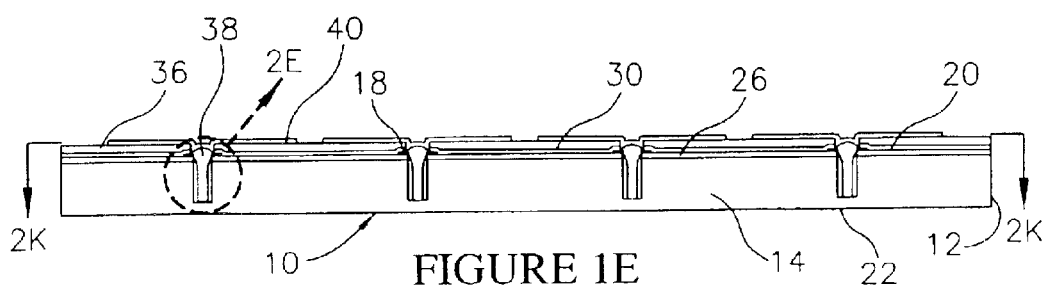
Figure 2E:
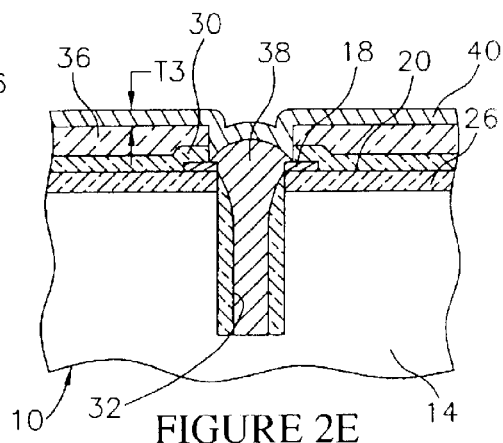
FIG. 2E is an enlarged view taken along line 2E of FIG. 1E illustrating a conductive member and a redistribution conductor.

Next, as shown in FIGS. 1E and 2E, a conductive material can be deposited in the openings 28 to form conductive members 38. The conductive material can comprise a highly conductive metal, such as nickel, gold, aluminum, titanium, iridium, copper, tungsten, silver, platinum, palladium, tantalum, molybdenum, tin, zinc and alloys of these metals. One of these metals can be deposited within the openings 28 using a deposition process, such as electrolytic deposition, electroless deposition, or CVD. Alternately a solder metal can be screen printed in the openings 28 and drawn into the openings 28 with capillary action or a vacuum.

Figure 2K:
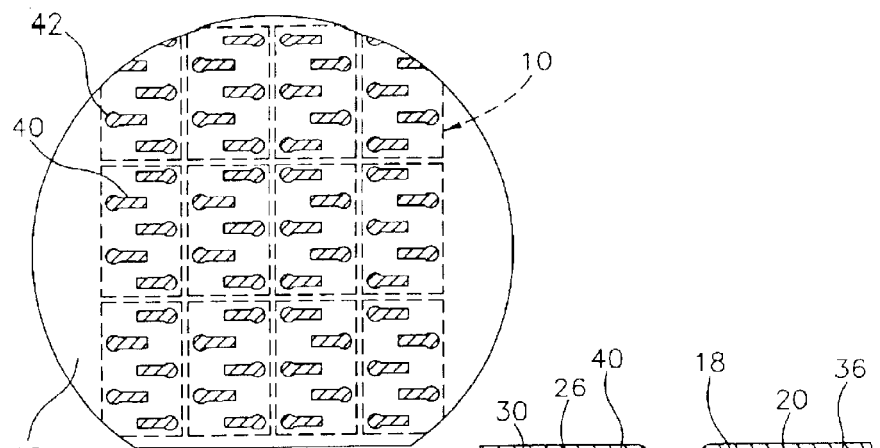
FIG. 2K is a cross sectional view taken along line 2K—2K of FIG. 1E illustrating redistribution conductors on the male component.

As also shown in FIGS. 1E and 2E, redistribution conductors 40 can be formed on the circuit side 20 in electrical communication with the die contacts 18 and the conductive members 38. As shown in FIG. 2K, the conductors 40 redistribute or "fan out" the pattern of the die contacts 18. In addition, the conductors 40 include bonding pads 42, which in the illustrative embodiment are enlarged, generally planar segments with hemispherical edges located at the terminal ends of the conductors 40. The conductors 40 can be laid out such that the bonding pads 42 are configured in a desired pattern, such as a dense area array (e.g., grid array). As such, the bonding pads 42 have a pattern that is different that the pattern of the die contacts 18. In addition, the bonding pads 42 can be configured to select a "chip select" function in which selected die contacts 18 can be addressed.

The conductors 40 and the bonding pads 42 preferably comprise a highly conductive metal layer such as copper. In addition, the conductors 40 and the bonding pads 42 can be formed using the same process and materials, or alternately can be formed separately. For example, copper can be electrolessly plated on the polymer layer 36 in a required pattern and a required thickness T3 using techniques that are known in the art. To perform the electroless plating process, the polymer layer 36 can be initially cleaned, and the wafer 12 dipped in an aqueous bath containing a catalyst configured to form a copper seed layer. Catalyst systems are commercially available from Lea Ronal of Freeport, N.Y. under the trademark "UMT CATALYST SYSTEM".

Following formation of the copper seed layer, a resist layer can be formed on the copper seed layer, and patterned to define the conductors 40 and the bonding pads 42 in the required pattern. Suitable resists, such as electro deposited resists, are available from Shipley Corporation of Newton, Mass. Next, the wafer 12 can be dipped in an electroless (or an electrolytic) copper plating solution, such that copper is applied to areas of the seed layer not covered by the resist. One suitable plating solution can include "RONADEP" manufactured by Lea Ronal and DI water. The copper can be electrolessly plated to form the conductors 40 and the bonding pads 42 with a thickness T3 of from about 1 μm to 4 μm.

Following electroless copper plating, the resist can be stripped by plasma etching or other suitable process. In addition, the exposed copper seed layer can be removed by etching, such that just the conductors 40 and the bonding pads 42 remain in the required pattern.

The outlined process for forming the conductors 40 and the bonding pads 42 by electroless plating is merely exemplary, and other processes known in the art can be employed to form the conductors 40 and the bonding pads 42 of copper or other metals, such as Al, Cr, Ti, Ni, W, Au, Ag, Ta, Mb. Other suitable deposition processes include CVD, PECVD, PVD, sputtering and evaporation. Also if desired, the conductive members 38, the conductors 40 and the bonding pads 42 can all be formed using the same deposition process.

Figure 1F:
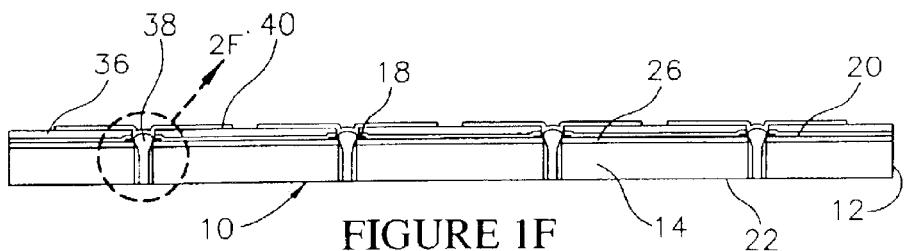
Figure 2F:
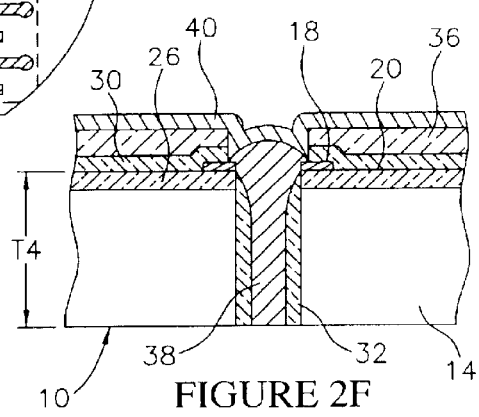
FIG. 2F is an enlarged view taken along line 2F of FIG. 1F illustrating the conductive member following thinning of the wafer.

Next, as shown in FIGS. 1F and 2F, the wafer 12 is thinned from the back side 22 to expose the conductive members 38. The thinning step can be performed using a mechanical planarization apparatus (e.g., a grinder). One suitable mechanical planarization apparatus is manufactured by Okamoto, and is designated a model no. VG502. The thinning step can also be performed using a chemical mechanical planarization (CMP) apparatus. A suitable CMP apparatus is commercially available from a manufacturer such as Westech, SEZ, Plasma Polishing Systems, or TRUSI. The thinning step can also be performed using an etch back process, such as a wet etch process, a dry etch process or a plasma etching process. A representative thickness T4 of the substrate 14 following the thinning step can be from 50 μm to 300 μm. As is apparent the thickness T4 is dependent on the depth D (FIG. 1B) of the openings 28.

Figure 1G:
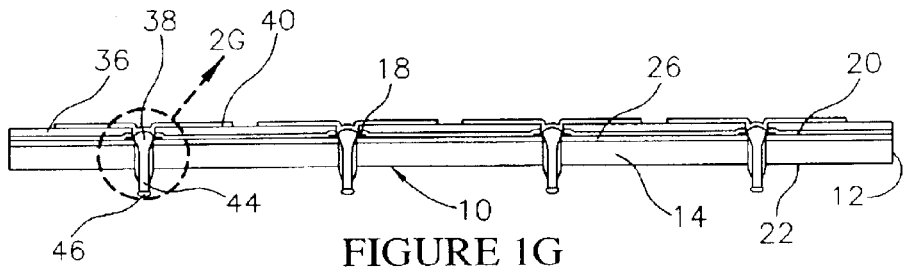
Figure 2G:
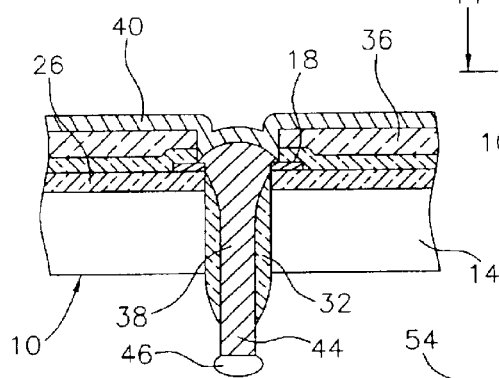
FIG. 2G is an enlarged view taken along line 2G of FIG. 1G illustrating the conductive member and a terminal contact thereon following etching of the wafer.

Next, as shown in FIGS. 1G and 2G, the wafer 12 is etched back from the back side 22 to expose terminal portions of the conductive members 38 and form pin contacts 44. The etch back step can be performed using a wet etching process, a dry etching process or a plasma etching process such as reactive ion etching (RIE). In addition to removing portions of the substrate 14 and exposing terminal portions of the conductive members 38, the etch back step also removes corresponding portions of the passivation layers 32.

As also shown in FIGS. 1G and 2G, non-oxidizing layers 46 can be formed on the tips of the pin contacts 44. The non-oxidizing layers 46 can comprise a non-oxidizing metal or metal alloy such as gold, a gold/nickel alloy or platinum. In addition, the non-oxidizing layers 46 can comprise bulbs that just coat the tips of the pin contacts 44, or alternately can cover all exposed surfaces thereof. The non-oxidizing layers 46 can be formed using a deposition or plating process, such as electroless deposition, electrolytic deposition or CVD. The completed pin contacts 44 can be used as the terminal contacts for the component 16 and to surface mount the component 16. In addition, as will be further explained, the pin contacts 44 can be used to physically and electrically connect multiple components 16 in a stacked assembly (e.g., assembly 68C—FIG. 6C). Further, prior to singulation of the wafer 12, the pin contacts 44 can be used to perform various wafer level test procedures such as functionality testing, parametric testing, adherence to required specifications testing and burn-in testing.

Figure 1H:
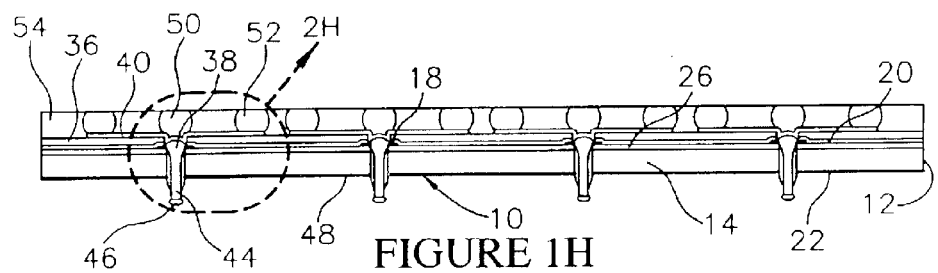
Figure 2H:
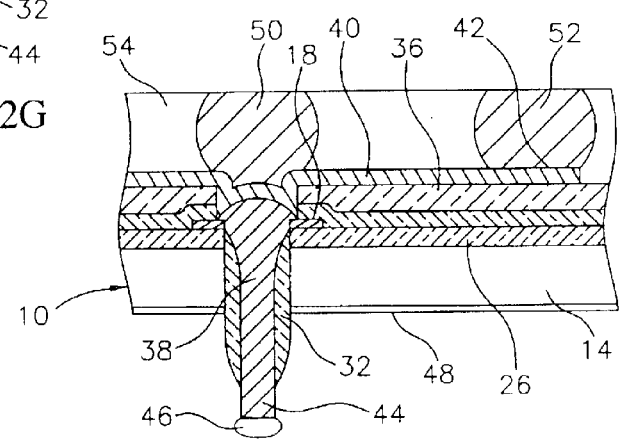
FIG. 2H is an enlarged view taken along line 2H of FIG. 1H illustrating circuit side contacts on the component.

Next, as shown in FIGS. 1H and 2H, a back side polymer layer 48 can be formed on the thinned substrate 14. The back side polymer layer 48 can comprise any of the polymer materials previously described for the polymer layer 36. Alternately, the back side polymer layer 48 can comprise a layer of vapor deposited parylene substantially as previously described for passivation layers 30, 32. During vapor deposition of the parylene, the pin contacts 44 can be protected using tape. Alternately, the pin contacts 44 can be coated with parylene which is can be subsequently stripped using a suitable stripper.

As also shown in FIGS. 1H and 2H, front side contacts 50 can be formed on the conductors 40 proximate to the conductive members 38, and redistribution contacts 52 can be formed on the bonding pads 42. The contacts 50, 52 can comprise metal bumps deposited on the conductors 40 and bonding pads 42 using a suitable deposition process, such as stenciling and reflow of a solder alloy. The contacts 50, 52 can comprise solder, another metal, or a conductive polymer material. The contacts 50, 52 can also be formed by electrolytic deposition, by electroless deposition, or by bonding pre-fabricated balls to the conductors 40 and the bonding pads 42. For example, a ball bumper can be employed to bond pre-fabricated balls. A suitable ball bumper is manufactured by Pac Tech Packaging Technologies of Falkensee, Germany. The contacts 50, 52 can also be formed using a conventional wire bonder apparatus adapted to form a ball bond or a stud bump, and then to sever the attached wire.

As also shown in FIGS. 1H and 2H, an outer polymer layer 54 can be formed on the conductors 40 and contacts 50, 52. The outer polymer layer 54 can comprise a low k polymer layer formed substantially as previously described for polymer layer 36. In addition, the outer polymer layer 54 and the contacts 50, 52 can be planarized to a same planar surface using a grinding or a chemical mechanical planarization process substantially as previously described for thinning the substrate 14. The planar surface facilitates subsequent processes such as singulation, surface mounting and stacking of the component 16. In addition to providing electrical insulation and protection, the outer polymer layer 54 also functions to rigidify and strengthen the attachment of the contacts 50, 52 to the conductors 40 and the bonding pads 42.

Figure 1I:
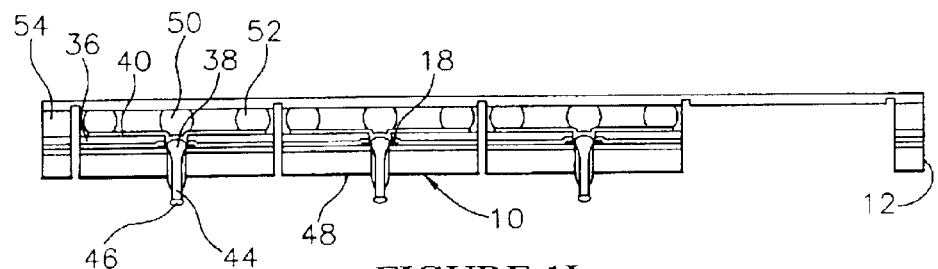

Next as shown in FIGS. 1I and 2I, a singulating step is performed to singulate the components 16 from the wafer 12 and from one another. The singulating step can be performed by attaching the wafer 12 to a dicing tape 56 and sawing grooves 58 through the wafer 12 using a conventional dicing saw. Alternately the singulating step can be performed by etching, water jetting or other suitable process.

As shown in FIG. 2I, a singulated component 16 includes the thinned die 10 having the die contacts 18 in electrical communication with the integrated circuits 24 (FIG. 2J) thereon. The component 16 also includes the planarized contacts 50, 52 on the circuit side 20 in electrical communication with the die contacts 18. The contacts 50, 52 can be used to selectively access the integrated circuits 24 for testing or other functions. In addition, for some applications the contacts 50, 52 can be used as the terminal contacts for the component 16.

The component 16 also includes the conductive members 38 in electrical communication with the die contacts 18, and the pin contacts 44 on the back side 22 of the die 10 in electrical communication with the conductive members 38. As previously stated, the pin contacts 44 can be arranged in a desired dense area array such as a pin grid array (PGA) or a micro pin grid array (MPGA). In addition, the pin contacts 44 can be used as the terminal contacts for the component 16, for surface mounting the component 16, or for stacking the component 16 in stacked electronic assemblies. The component 16 also includes the outer polymer layer 54, and the back side polymer layer 48.

Referring to FIGS. 3A–3E, different embodiments of the component 16 (FIG. 2I) are illustrated. In FIG. 3A, a component 16A includes a thinned die 10A, conductive members 38A, and back side pin contacts 44A formed using a circuit side process substantially as previously described. In addition, the component 16A includes an outer polymer layer 54A but no circuit side contacts. In this embodiment the pin contacts 44A are the terminal contacts for the component 16A, and permit the component 16A to be surface mounted to a mating electronic element such as a module substrate, a package substrate, a socket or a circuit board.

In FIG. 3B, a component 16B includes a thinned die 10B, conductive members 38B and pin contacts 44B formed using a circuit side process substantially as previously described. In addition, the component 16B includes front side redistribution contacts 52B which comprise metal balls, such as solder balls or bumps, embedded in an outer polymer layer 54B. The contacts 52B can be formed by forming or bonding metal bumps or balls to bonding pads 42B substantially as previously described. In addition, the contacts 52B can be used as terminal contacts and to flip chip mount the component 16B to a mating electronic element such as a module substrate, a package substrate or a circuit board. The contacts 52B can also be used for testing applications or to selectively address the integrated circuits 24 (FIG. 2J).

In FIG. 3C, a component 16C includes a thinned die 10C, conductive members 38C and pin contacts 44C formed using a circuit side process substantially as previously described. In addition, the component 16C includes front side contacts 50C which comprise metal balls, such as solder balls or bumps, embedded in an outer passivation layer 54C. The contacts 50C can be used as terminal contacts, and to flip chip mount the component 16C to a mating electronic element such as a module substrate, a package substrate or a circuit board. The contacts 50C can also be used for testing applications, or to selectively address the integrated circuits 24 (FIG. 2J).

In FIG. 3D, a component 16D includes a thinned die 10D, conductive members 38D and front side contacts 50D, which comprise metal balls, such as solder balls or bumps, embedded in an outer passivation layer 54D. In addition, the component 16D includes back side contacts 60D in the form of metal bumps or balls formed on pads 64D in electrical communication with the conductive members 38D. In this embodiment the die 10D can be thinned by grinding or CMP, but not etched to expose the conductive members 38D as previously described. In addition, the pads 64D can be formed using a suitable process such as patterning of a metal layer, and the conductive members 38D formed, or bonded, to the pads 64D using a suitable bonding or deposition process.

In FIG. 3E, a component 16E includes a thinned die 10E and back side contact pins 38E in electrical communication with conductive members 38E substantially as previously described. The component 16E also includes front side pin contacts 62E formed on the conductive members 38E. The front side pin contacts 62E can comprise pins or stud bumps bonded to the conductive members 38E using a wire bonder, a stud bumper or other suitable apparatus. The pin contacts 62E can be used as terminal contacts, test contacts or in stacked assemblies.

Figure 5A:
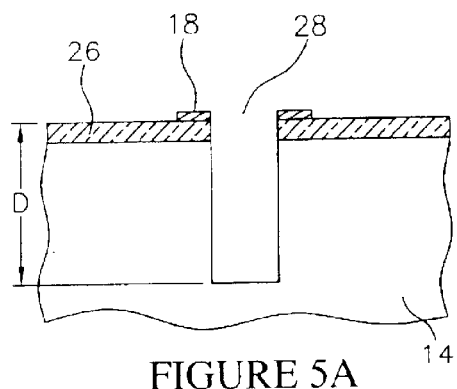
FIG. 5A is an enlarged view taken along line 5A of FIG. 4A illustrating an opening in a die contact.

Referring to FIGS. 4A–4F and 5A–5F, steps in a fabrication method for an alternate embodiment female component 16F (FIG. 5F) are illustrated. Initially as shown in FIGS. 4A and 5A, the wafer 12 containing the semiconductor dice 10 having the die contacts 18 is provided. In addition, openings 28 are formed through the die contacts 18, and part way through the substrate 14, substantially as previously described.

Figure 5B:
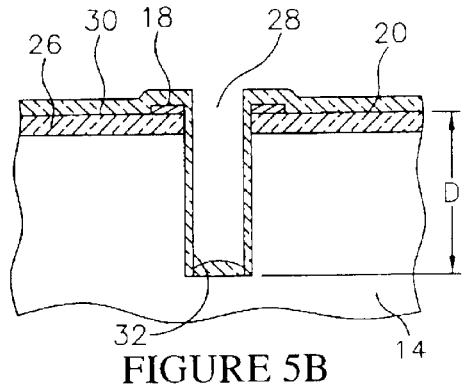
FIG. 5B is an enlarged view taken along line 5B of FIG. 4B illustrating passivation layers.

Next, as shown in FIGS. 4B and 5B, the electrically insulating passivation layer 30 is formed on the circuit side 20, and the electrically insulating passivation layer 32 are formed on sidewalls of the openings 28, substantially as previously described.

Figure 5C:
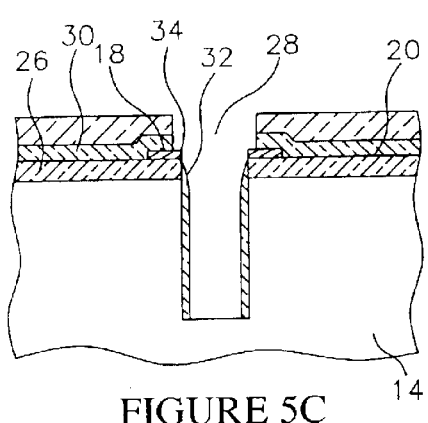
FIG. 5C is an enlarged view taken along line 5C of FIG. 4C illustrating an insulating layer.

Next, as shown in FIGS. 4C and 5C, the passivation layers 30, 32 are patterned to expose the exposed portions 34 of the die contacts 18 substantially as previously described.

Figure 5D:
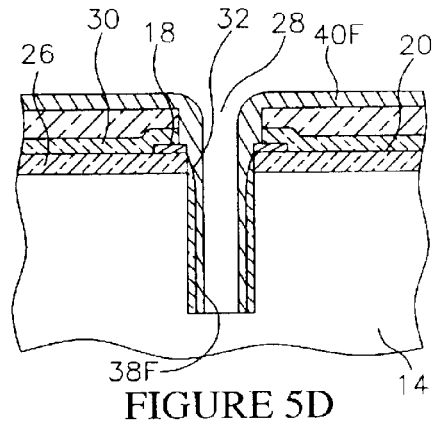
FIG. 5D is an enlarged view taken along line 5D of FIG. 4D illustrating redistribution conductors.

Next, as shown in FIGS. 4D and 5D, female conductive members 38F are formed in the openings 28, and redistribution conductors 40F are formed on the circuit side 20 in electrical communication with the conductive members 38F. However, in this embodiment the conductive members 38F do not completely fill the openings 28. Rather, the openings 28 and the conductive members 38F form through openings sized to electrically engage the pin contacts 44, 44B (FIG. 2I) on adjacent components 16, 16B in a stacked assembly 68C (FIG. 6C). The conductive members 38F can be formed in electrical communication with the die contacts 18 by depositing a conductive layer on only the sidewalls of the electrically insulated openings 28. The same conductive layer can also form the redistribution conductors 40F, and can be deposited using an electroless process, an electrolytic process or a CVD process substantially as previously described. Alternately, the conductive members 38F and the conductors 40F can be formed using separate processes. As another alternative, a conductive layer can be deposited to completely fill the openings 28, and then etched to re-open or partially fill the openings 28 and form the conductors 40F.

Figure 5E:
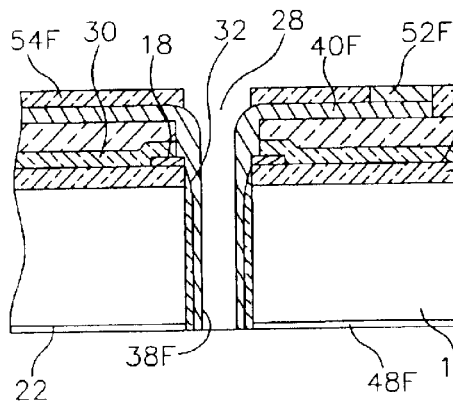
FIG. 5E is an enlarged view taken along line 5E of FIG. 4E illustrating an outer insulating layer.

Next, as shown in FIGS. 4E and 5E, the substrate 14 is thinned, substantially as previously, described to expose the openings 28 and the conductive members 38F. In addition, a back side polymer layer 48F can be formed on the thinned backside 22 substantially as previously described for back side polymer layer 48.

As also shown in FIGS. 4E and 5E, redistribution contacts 52F are formed on, or in electrical communication with, the conductors 40F. In this embodiment the redistribution contacts 52F comprise planar pads formed using a subtractive process (etching through a mask) or an additive process (deposition through a mask). Alternately the redistribution contacts 52F can comprise planarized bumps or balls, as previously described for redistribution contacts 52 (FIG. 2I). As also shown in FIGS. 4E and 5E, an outer insulating layer 54F can be formed on the conductors 40F substantially as previously described for outer insulating layer 54.

Next as shown in FIG. 4F, a singulating step is performed to singulate the components 16F from the wafer 12 and from one another. The singulating step can be performed by attaching the wafer 12 to a dicing tape 56 and sawing grooves 58 through the wafer 12 substantially as previous described.

Figure 5F:
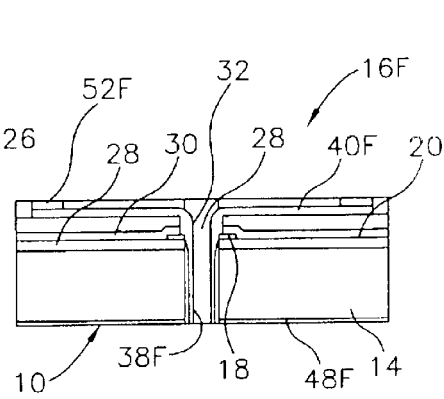
FIG. 5F is an enlarged schematic cross sectional view illustrating the completed alternate embodiment female component.

As shown in FIG. 5F, a singulated component 16F includes the thinned die 10 having the die contacts 18 in electrical communication with the integrated circuits 24 (FIG. 2J) thereon. The component 16F also includes the redistribution contacts 52F on the circuit side 20 in electrical communication with the die contacts 18. The contacts 52F can be used to selectively access the integrated circuits 24 for testing or other functions. In addition, for some applications the contacts 52F can be used as the terminal contacts for the component 16F.

The component 16F also includes the conductive members 38F which comprise the plated openings 28 in electrical communication with the die contacts 18. The conductive members 38F are configured to electrical engage the pin contacts 44, 44B (FIG. 2I) on adjacent components 16, 16B in a stacked assembly 68C (FIG. 6C). The component 16F also includes the outer polymer layer 54F, and the back side polymer layer 48F.

Figure 6A:
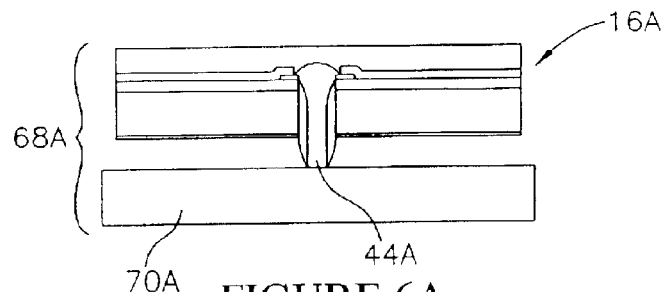
FIGS. 6A–6C are schematic cross sectional views illustrating electronic assemblies fabricated using components constructed in accordance with the invention.
Figure 6B:
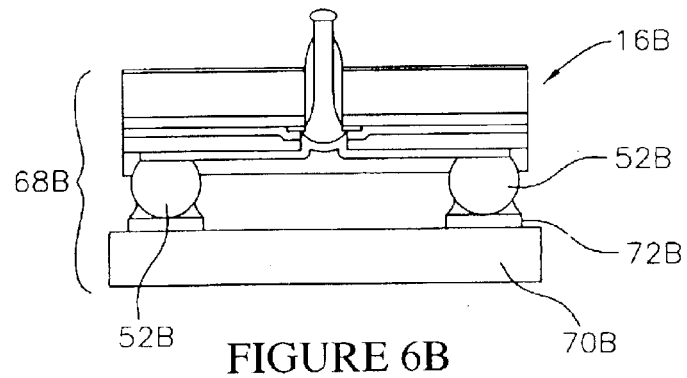
Figure 6C:
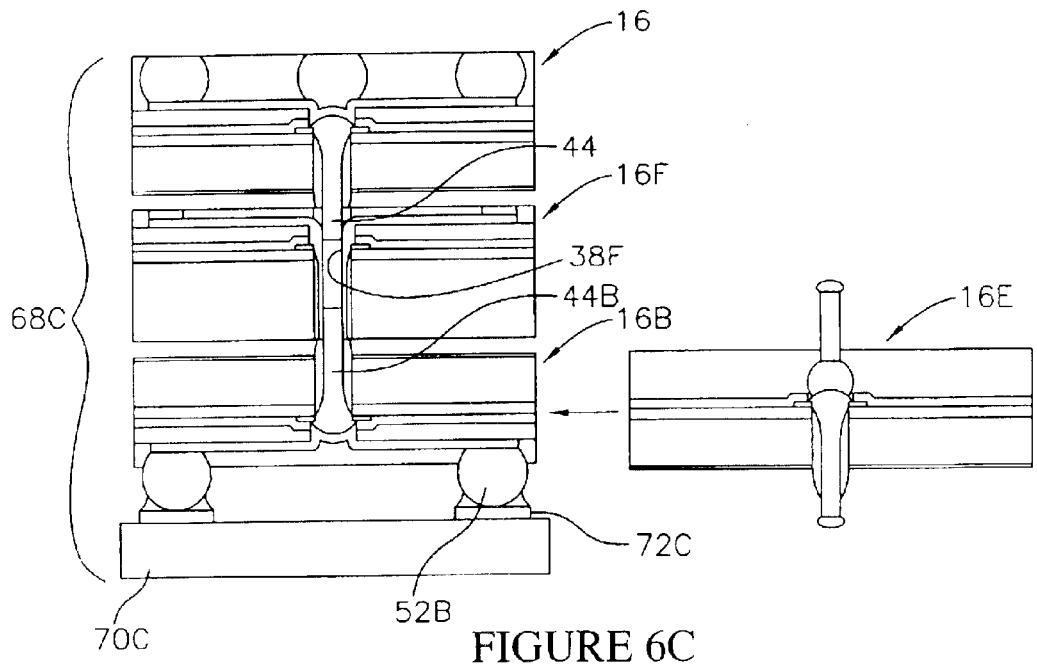

Referring to FIGS. 6A–6C, electronic assemblies fabricated using the components 16A–16F are illustrated. In FIG. 6A, a pin mount electronic assembly 68A includes a support substrate 70A and one or more components 16A surface mounted to the supporting substrate 70A. The supporting substrate 70A can comprise a module substrate, a package substrate or a circuit board. In addition, the pin contacts 44A on the component 16A are soldered or otherwise connected to mating contacts (not shown) on the supporting substrate 70A.

In FIG. 6B, a flip chip electronic assembly 68B includes a support substrate 70B, and one or more components 16B flip chip mounted to the substrate 70B. The support substrate 70B includes electrodes 72B and the contacts 52B on the component 16B are bonded to the electrodes 72B.

In FIG. 6C, a stacked electronic assembly 68C includes a support substrate 70C having electrodes 72C. The component 16B forms the lower tier of the stacked electronic assembly 68C, and includes contacts 52B bonded to the electrodes 72C on the support substrate 70C. The female component 16F forms the middle tier of the stacked electronic assembly 68C. In addition, the female conductive members 38F on the female component 16F physically and electrically engage the pin contacts 44B on the component 16B. If desired, the pin contacts 44B can be bonded to the female conductive members 38F by soldering or other bonding process (e.g., conductive polymer adhesives). In addition, spacers (not shown) can be used to space the female component 16F from the component 16B. The component 16 forms the upper tier of the stacked electronic assembly 68C with the female conductive members 38F on the female component 16F physically and electrically engaging the pin contacts 44 on the component 16.

As another alternative, the double pin component 16E of FIG. 3E can be substituted for the component 16B to form the lower tier of the stacked electronic assembly 68C. Alternately other arrangements of the components 16A–16F can be employed to form other stacked assemblies.

Thus the invention provides an improved semiconductor component, a method for fabricating the component, and systems incorporating the component. While the invention has been described with reference to certain preferred embodiments, as will be apparent to those skilled in the art, certain changes and modifications can be made without departing from the scope of the invention as defined by the following claims.

What is claimed is:

1. A method for fabricating a semiconductor component comprising:

providing a semiconductor substrate comprising a circuit side, a back side, and a plurality of die contacts on the circuit side;

forming openings through the die contacts and part way through the substrate;

forming conductive members in the openings in electrical contact with the die contacts; and thinning the substrate from the back side to expose terminal portions of the conductive members.

2. The method of claim 1 wherein the forming the openings step comprises laser machining the substrate.

3. The method of claim 1 wherein the forming the openings step comprises etching the die contacts and laser machining the substrate.

4. The method of claim 1 wherein the substrate comprises a semiconductor die and the die contacts comprise bond pads.

5. The method of claim 1 wherein the thinning the substrate step comprise grinding and etching the substrate.

6. The method of claim 1 wherein the substrate comprises a semiconductor die on a wafer and the wafer is tested following the thinning step using the terminal portions.

7. A method for fabricating a semiconductor component comprising:

providing a plurality of semiconductor dice on a wafer having a circuit side and a back side, each die comprising a plurality of integrated circuits and a plurality of bond pads on the circuit side in electrical communication with the integrated circuits;

forming openings in the bond pads and part way through the wafer;

forming conductive members in the openings in electrical contact with the bond pads; and thinning the wafer from the back side to expose terminal portions of the conductive members.

8. The method of claim 7 wherein the terminal portions comprise pins in an area array.

9. The method of claim 7 further comprising forming non-oxidizing layers on the terminal portions.

10. The method of claim 7 further comprising forming conductors on the circuit side in electrical communication with the conductive members and circuit die contacts on the conductors.

11. The method of claim 7 wherein the thinning step comprises grinding the wafer to expose the conductive members and then etching the wafer to expose the terminal portions.

12. The method of claim 7 further comprising testing the wafer following the thinning step using the terminal portions as electrical connection points.

13. The method of claim 7 wherein the conductive members are configured to physically engage a pin contact on a mating component.

14. A method for fabricating a semiconductor component comprising:

providing a semiconductor die comprising a circuit side a back side, a substrate and a plurality of die contacts on the circuit side;

forming openings in the die contacts and part way through the substrate;

electrically insulating the openings;

depositing a conductive material in the openings and on the die contacts; and thinning the substrate from the back side to expose the conductive material and form pin contacts on the back side.

15. The method of claim 14 further comprising forming conductors on the circuit side in electrical communication with the die contacts and forming circuit side contacts on the conductors.

16. The method of claim 14 wherein the providing step comprises providing the die on a wafer comprising a plurality of dice and the method further comprises a singulating step for separating the die from the wafer.

17. The method of claim 16 further comprising prior to the singulating step testing the die using the pin contacts.

18. The method of claim 14 wherein the forming the openings step comprises etching the die contacts and laser machining the substrate.

19. The method of claim 14 wherein the electrically insulating the openings step comprises depositing a polymer in the openings.

20. The method of claim 14 wherein the electrically insulating the openings step comprises vapor depositing parylene in the openings.

21. The method of claim 14 the thinning step comprises grinding the substrate and then etching the substrate.

22. A method for fabricating a semiconductor component comprising:

providing a semiconductor die comprising a circuit side a back side, a substrate and a plurality of die contacts on the circuit side;

forming a plurality of openings in the die contacts and part way through the substrate;

electrically insulating the openings;

plating the openings; and thinning the substrate from the back side to expose the openings.

23. The method of claim 22 further comprising forming a plurality of conductors on the circuit side in electrical communication with the die contacts.

24. The method of claim 22 wherein the providing step comprises providing the die on a wafer comprising a plurality of dice and the method further comprises a singulating step for separating the die from the wafer.

25. The method of claim 22 wherein the forming the openings step comprises etching the die contacts and laser machining the substrate.

26. The method of claim 22 wherein the die contacts comprise bond pads.

27. The method of claim 22 wherein the electrically insulating the openings step comprises vapor depositing parylene into the openings.

* * * * *